US006174571B1

(12) United States Patent
Corderman et al.

(10) Patent No.: US 6,174,571 B1
(45) Date of Patent: Jan. 16, 2001

(54) METHOD OF USING A SUBSTRATE OFFSET TO OBTAIN A SPECIFIC ALLOY CHEMISTRY FROM A METAL ALLOY EB-PVD COATING PROCESS

(75) Inventors: Reed Roeder Corderman, Niskayuna; Richard Arthur Nardi, Jr., Scotia, both of NY (US)

(73) Assignee: General Electric Company, Schenectady, NY (US)

(*) Notice: Under 35 U.S.C. 154(b), the term of this patent shall be extended for 0 days.

(21) Appl. No.: 09/387,373

(22) Filed: Aug. 31, 1999

(51) Int. Cl.$^7$ .................................................. C23C 14/30
(52) U.S. Cl. .......................... 427/585; 427/596; 427/597; 427/248.1; 427/250
(58) Field of Search ................................... 427/585, 596, 427/597, 248.1, 250

(56) References Cited

U.S. PATENT DOCUMENTS 4,701,592 * 10/1987 Cheung .
5,993,904 * 11/1999 Boucher .

OTHER PUBLICATIONS

"An Algorithm for Optimization of Experimental Parameters for Maximum Uniformity of Film Thickness," Ramprasad, B.S., Radha, T.S., and Ramakriskna Rao, M., J., Vac. Sci. Technol. 9 (3) 1104–05 (1972). (No month).
"The Deposit of Films of Uniform Thickness for Interferometer Mirrors," Fisher, R.A., Platt, J.R. Rev. Sci. Instrum 8 505–7 (1937). (No month).
"On Uniformity of Film Thickness on Rotating Substrates," Ramprasad, B.S., Radha, T.S., and Ramakriskna Rao, M., Vac. Sci. Technol. 9 (4) 1227–28 (1972). (No month).
"Thickness Distribution and Step Coverage in a New Planetary Substrate Holder Geometry," Behrndt, K.H. J. Vac. Sci. Technol. 9 (2) 995–1007 (1972). (No month).

"Optimum Geometry for Uniform Deposits on a Rotating Substrate from a Point source," Ramprasad, B.S., Radha, T.S., Vacuum 24 (4) 165–66 (1974). (No month).
"The distribution of Thin Films Condensed on Surfaces by the Vacuum Evaporation Method," Holland, L. and Steckelmacher. W., Vacuum 11 (4) 346–64 (1952) (No months).
"Optical Applications of Dielectric Thin Films," Lissberger, P.H., Rept. Prog. Phys. 33, 197–268 (1970). (No month).
"Distributing and Apparent Source Geometry of Electron-Beam–Heated Evaporation Sources," E.B. Graber, J. Vac. Sci. Technol. 10 (1) 103–03 (1973). (No month).

(List continued on next page.)

Primary Examiner—Timothy Meeks
(74) Attorney, Agent, or Firm—Noreen C. Johnson; Douglas E. Stoner

(57) ABSTRACT

A method of making an evaporated deposit of a material comprising the steps of: (i) positioning at least one test substrate above a vapor source wherein at least a portion of the at least one test substrate is not perpendicularly disposed to vapor source, (ii) heating the vapor source in a vacuum to evaporate the vapor source, (iii) condensing a deposit evaporated from the vapor source on the at least one test substrate such that at least a portion of the deposit is not perpendicularly deposed to the vapor source, (iv) measuring the chemical composition of the deposit at various positions relative to a line normal to the vapor source, (v) repeating steps (i) through (iv) until a deposit having a desired chemical composition is measured, (vi) removing each of the at least one test substrate, (vii) positioning a workpiece above the vapor source at a location corresponding to that of the test substrate upon which a deposit of desired chemical composition is condensed and measured, (viii) heating the vapor source in a vacuum to evaporate the vapor source, and (ix) condensing a deposit evaporated from the vapor source on the workpiece.

13 Claims, 4 Drawing Sheets

OTHER PUBLICATIONS

"A Spatial Distribution Study of A Beam Vapour Emitted by Electron–Beam–Heated Evaporation Sources," D. Chaleix, P. Choquet, A Bessaudou, L. Frugler, and J Machet, J. Phys. D.: Appl. Phys. 29 218–24 (1996). (No month).

"Thickness Distribution of a Metal–Alloy from a High–Rate Electron–Beam Source," E.D. Erickson, J. Vac. Sci. Technol. 11 (1) 366–70 (1974). (No month).

* cited by examiner

METHOD OF USING A SUBSTRATE OFFSET TO OBTAIN A SPECIFIC ALLOY CHEMISTRY FROM A METAL ALLOY EB-PVD COATING PROCESS

BACKGROUND OF THE INVENTION

The invention relates to methods for applying protective coatings of a desired composition on articles by physical vapor deposition.

The thermal evaporation and condensation of solid materials, such as metals, ceramics and inorganic compounds, to form layers is a developed art. There are many prior art techniques and apparatuses that permit such materials to be evaporated from a source and condensed to form a layer on a substrate that is disposed a distance from the source. The processes involve heating a material to be evaporated to a temperature at which it has a significant vapor pressure, thus creating a vapor stream. Heating techniques include direct heating methods, such as heating the material to be deposited directly using resistance, induction, electron beam or lasers to melt all or some portion of the material to be evaporated, or indirect heating methods, such as by heating the surface of a higher melting material and flashing the material to be evaporated off the hot surface.

A coating composition is related to the composition of the evaporant source. Typically, substrates are positioned perpendicularly above, (i.e., in "line-of-sight"), of a vapor source for coating thereby. Different coating compositions at the line-of-sight position can be achieved by varying the composition of the evaporant source.

Generally, the evaporant source should be replenished as material is gradually consumed during the evaporation process. In this respect, where the vapor source is a molten pool held in a crucible, the bottom of the crucible can be adapted to provide an opening for receiving the continuous feed of a solid bar or ingot of the evaporating material. The evaporant source composition and, therefore, coating composition are dependent on the composition of the ingot. Accordingly, a desired coating composition at the line-of-sight position can be achieved by controlling ingot composition.

In some cases, depending on the materials involved, ingot composition is dictated by fabrication considerations. For instance, for a given group of materials, attempt to manufacture ingots of certain compositions will result in ingots that are unduly brittle or otherwise mechanically unsuitable. In such cases, control of ingot composition is severely limited and, therefore, control of coating composition at the line-of-sight is more difficult. Therefore, a need exists for a process to deposit materials for controlling the deposit composition.

SUMMARY OF THE INVENTION

It has been determined that the chemical composition of a deposited material on a substrate that is deposited by vapor deposition can vary from the chemical composition of the vapor source, and in particular can be caused to vary as a function of horizontal displacement of the substrate from a line normal to the surface of a vapor source. Accordingly, in order to be able to obtain a coating of a consistent, desired composition with an evaporant source of a fixed chemical composition, the invention provides a method of forming evaporated deposits of a desired composition on a plurality of workpieces, comprising the steps of:

i) disposing a plurality of workpieces above a vapor source, each workpiece positioned at a first vertical distance above the vapor source and at a first horizontally-disposed distance from a line extending perpendicularly upward from the vapor source, to provide a deposit thereon of a desired composition;

ii) heating the vapor source in a vacuum and evaporating a part of the vapor source; and iii) condensing deposits evaporated from the vapor source on the workpieces.

The distances may be obtained in a number of ways. In one embodiment of the method of the invention, the such first vertical distance above the vapor source and the first horizontally displaced distance from the line corresponds to those distances determined by the following steps, namely:

(i) disposing an elongate test specimen a spaced distance above a vapor source so that the test specimen possesses a surface extending horizontally from a line extending perpendicularly upward from the vapor source to a position horizontally displaced from the line;

(ii) heating the vapor source in a vacuum to evaporate the vapor source;

(iii) condensing a deposit evaporated from the vapor source on the surface of the test specimen;

(iv) measuring the chemical composition of the deposit on the surface at various horizontally displaced positions thereon relative to the line; and (v) selecting a desired horizontally displaced distance as a the horizontally-displaced distance that provides a deposit of the desired chemical composition.

In another embodiment for determining the first vertical distance above the vapor source and the first horizontally displaced distance from the line, the distances are determined by the following steps:

(i) disposing a test specimen a spaced distance above a vapor source so that the test specimen possesses a surface extending horizontally from a line extending perpendicularly upward from the vapor source to a position horizontally displaced from the line;

(ii) heating the vapor source in a vacuum to evaporate the vapor source;

(iii) condensing a deposit evaporated from the vapor source on the surface of the test specimen;

(iv) measuring the chemical composition of the deposit on the surface at various horizontally displaced positions thereon relative to the line; and (v) selecting a desired horizontally displaced distance for the workpieces as a horizontally-displaced distance that provides a deposit of the desired chemical composition at the spaced distance above the vapor source.

Another aspect of the present invention for determining the first vertical distance above the vapor source and the first horizontally displaced distance from the line, the distances are determined by the following steps:

(i) disposing a test specimen a spaced distance above a vapor source and a horizontally spaced distance from a line extending perpendicularly upward from the vapor source from the line;

(ii) heating the vapor source in a vacuum to evaporate the vapor source;

(iii) condensing a deposit evaporated from the vapor source on the test specimen;

(iv) measuring the chemical composition of the deposit on the specimens;

(v) repeating steps (i) to (iv) above, in each instance locating the test specimen a different horizontally spaced distance from the line; and (vi) selecting as a desired horizontally displaced distance and vertical spaced distance for the workpieces the horizontally-displaced distance and vertically spaced distance that provided a deposit of the desired chemical composition on a test specimen.

BRIEF DESCRIPTION OF THE DRAWINGS

The invention will now be described with reference to the accompanying drawings, in which.

DESCRIPTION OF THE INVENTION

The invention comprises a method for providing a chemical composition of deposits of a material evaporated from a vapor source and deposited on a plurality of locations on a substrate positioned vertically above the vapor source. At least a portion of the substrate is "non-normal" to or not in "line-of-sight" of the vapor source. As referred to herein, and referring to FIGS. 1, 2, and 3, "line-of-sight" means a line 40 normal to the substrate surface extending perpendicularly outwardly from the plane of the vapor source.

Figure 3:
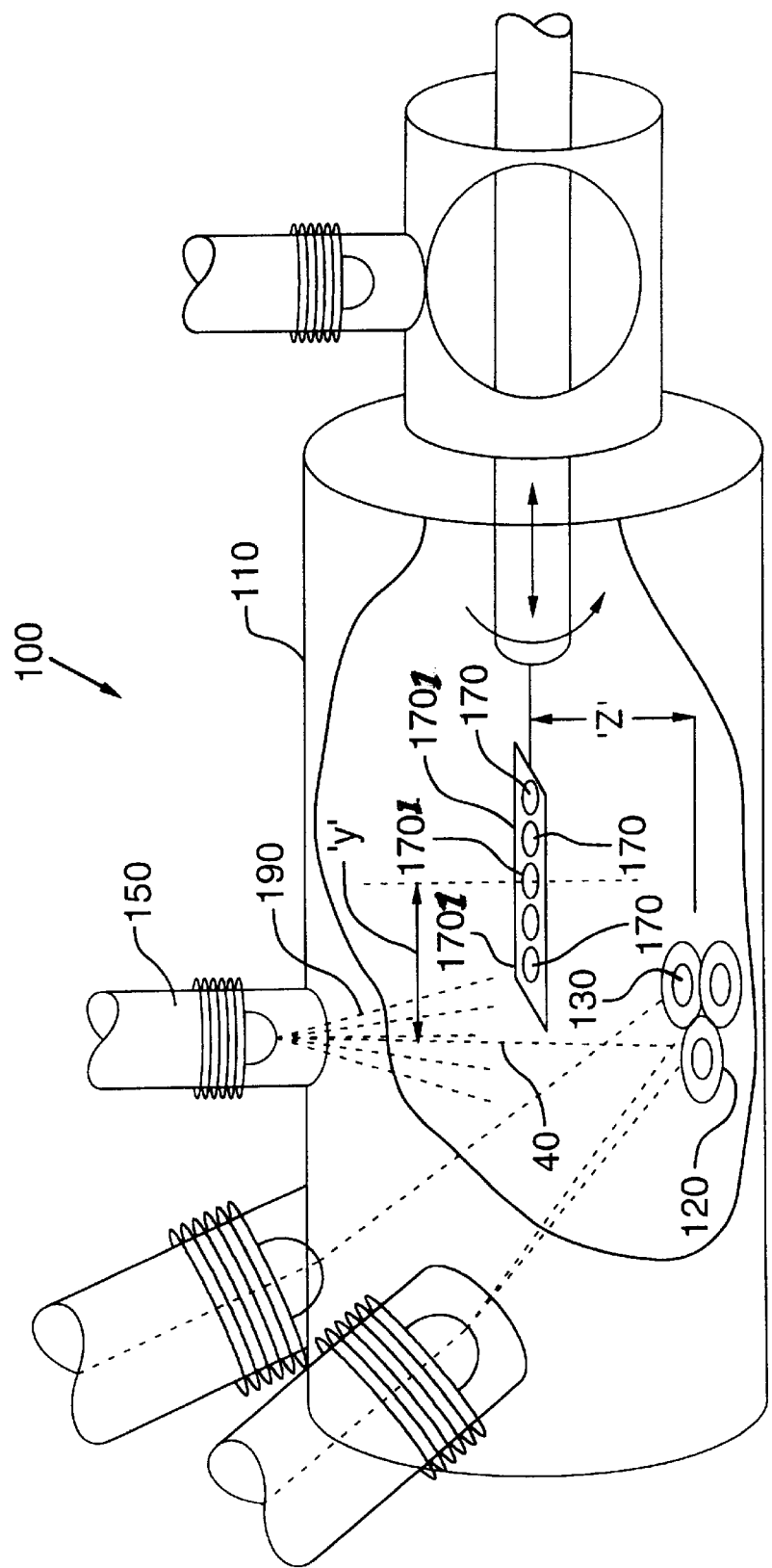
FIG. 3 is a schematic diagram of an apparatus used for performing the method of the invention.

Referring to FIG. 3, the vapor source comprises a molten metal pool 130 of material to be deposited on a workpiece 1701. Workpieces or "substrates" upon which a material is to be deposited typically comprise metal alloys, such as but not limited to, alloys used to form turbine blades that are to be coated with a corrosion resistant or wear-resistant coating, or the like. The workpiece 1701 may comprise a turbine blade. The molten metal pool 130 can be held in a crucible 120 and replenished with additional quantities of the material as the material is gradually consumed during the evaporation process. In this respect, the bottom of the crucible 120 can provide an opening for receiving the continuous feed of a solid bar or ingot of the evaporating material (not shown). The ingot feed rate can be controlled to keep the molten pool surface at a constant level, which may be desired to obtain specific deposit composition on the substrate when positioned at displaced positions from the "line-of-sight" with respect to the molten pool 130 surface.

Figure 1:
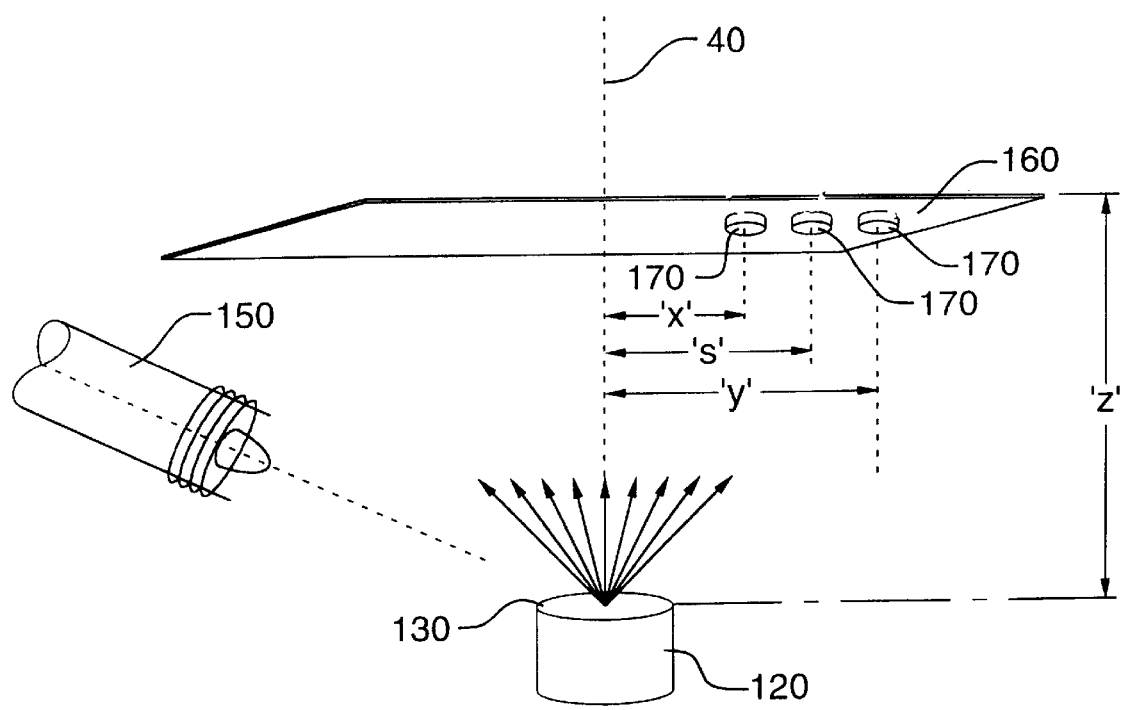
FIG. 1 is a schematic diagram illustrating the condensing of a "non-normal" evaporating ingot deposit from an evaporating vapor source using the method of the invention.
Figure 2:
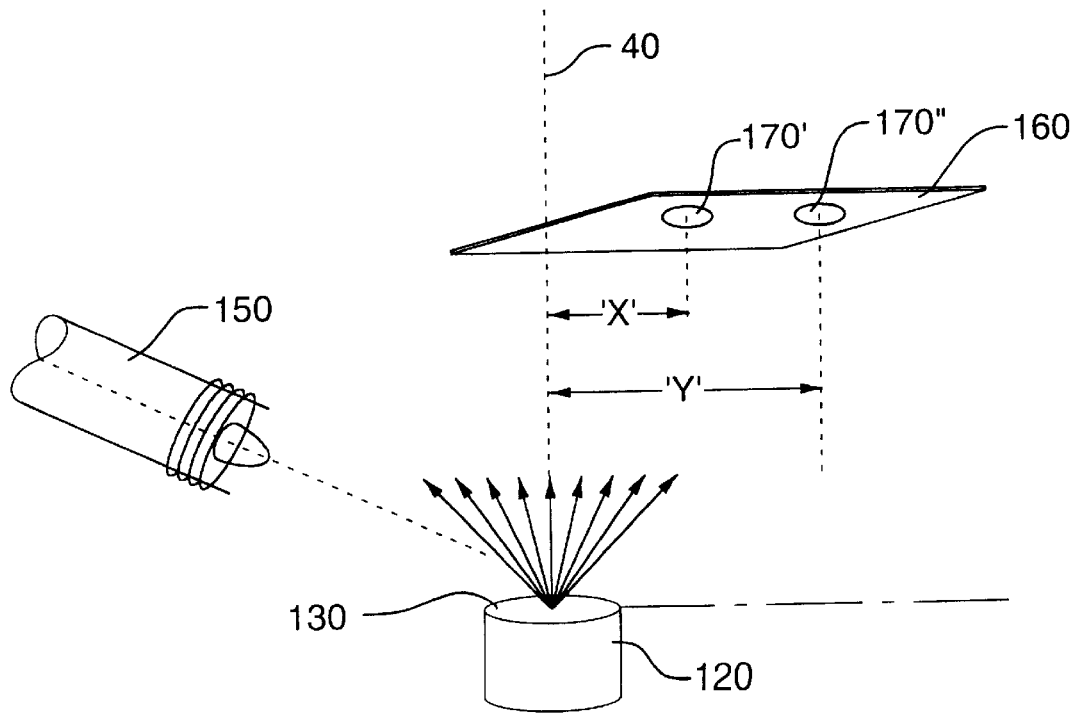
FIG. 2 is a schematic diagram illustrating a method for determining the horizontal displaced offset to provide the desired chemical composition of the deposit on the substrate.

The vapor source can be heated by any suitable heating means, including, but not limited to resistance heaters, induction coils, and electron beam guns 150 (see FIGS. 1, 2, and 3). In the case of materials characterized by low vapor pressures, the heating means is an electron beam gun 150 that is rastered over the top surface of the molten pool 130.

The method measures the chemical composition of evaporated deposits 170 as a function of the distance 'y' by which the deposit 170 is offset from the line-of-sight 40 of the molten pool 130 that serves as the vapor source. The chemical composition of the evaporated deposits 170 may be obtained using at least one of standard x-ray fluorescence, atomic emission spectroscopy, or electron microprobe analysis techniques. From this, an actual work piece can be positioned at a location corresponding to that of the test specimen 160, upon which a deposit of desired chemical composition can be condensed and measured.

With reference to FIG. 3, the invention provides forming a deposit of a material, comprising steps of i) positioning a plurality of workpieces 1701, which are desired to be coated with a deposit 170 above a vapor source, which in FIG. 3 is the molten pool 130, at a first vertical distance 'z' above the molten pool 130 and at a first horizontally-disposed distance 'y' from a line 40 extending perpendicularly upward from the vapor source to provide a deposit thereon of a specific desired composition; ii) heating the molten pool 130 in a vacuum enclosure 110 and evaporating a part of molten metal pool 130; and iii) condensing deposits 170 evaporated from the molten metal pool 130 on the workpieces 1701.

FIGS. 1 and 2 depict methods for determining the amount of horizontal offset 'y' to give, within a certain range, a deposit 170 of a desired (but usually different) composition than the molten pool 130 that serves as the vapor source. FIG. 1 determining a displaced horizontal distance 'y' comprises (i) positioning a plurality of test specimens 160 a variety of spaced distances 'x', 's', 'y' above a molten pool 130 that serves as a vapor source, in which the various horizontally spaced distances 'x', 's', 'y' are from a line 40 extending perpendicularly upward from the molten pool 130; (ii) heating the vapor source in a vacuum chamber 110 to evaporate the vapor source;(iii) condensing a deposit 170 evaporated from the vapor source on the test specimens 160; (iv) measuring the chemical composition of the deposit 170 on the specimens 160; and (v) selecting as a desired horizontally displaced distance for the workpieces the horizontally-displaced distance 'y' that provided a deposit 170 of the desired chemical composition on a test specimen 160.

Alternatively, only a single specimen 160 may be used at a time, each repetition of evaporating, depositing and measuring varying the horizontally displaced distance of the specimen 'x' to 's' and so on until a horizontally displaced distance 'y' is found the provide the desired chemical composition of the deposit 170. Thereafter, the workpieces may be situated at a horizontally displaced distance 'y' to undergo the vapor deposition process, maintaining such distance 'y' for each of the workpieces 1701.

FIG. 2 depicts yet an alternative process for determining the first horizontal offset distance 'y' to achieve the desired chemical composition. The process comprises i) positioning an elongate test specimen 160 a spaced distance 'z' above a vapor source so that the test specimen 160 possesses a surface extending horizontally from a line 40 extending perpendicularly upward from the vapor source 130 to a position horizontally displaced by distance 'x' from the line 40; (ii) heating the vapor source 130 in a vacuum to evaporate the vapor source; (iii) condensing a deposit 170' evaporated from the vapor source on the surface of the test specimen 160; (iv) measuring the chemical composition of the deposits 170', 170" so formed on the surface at various other horizontally displaced positions 's', 'y' thereon relative to the line 40; and (v) selecting as a desired horizontally displaced distance 'y' the distance, which provides a deposit 170" of the desired chemical composition.

The method of the invention can facilitate the replenishment of materials in the vapor source as material is gradually consumed during the evaporation process. In this respect, where the vapor source comprises a molten pool 130 held in a crucible 120, the bottom of the crucible 120 can comprise an opening for receiving the continuous feed of a solid bar or ingot of the evaporating material. The ingot feed rate can be controlled to keep the molten pool surface at a constant level to obtain a deposit of a desired chemical composition on the work piece.

The method is particularly suited for materials from which ingots of a desired chemical composition cannot be fabricated for the making of an evaporated line-of-sight deposit of a desired chemical composition. For some materials, attempts to manufacture ingots of certain compositions will result unduly brittle or otherwise mechanically unsuitable materials. For instance, hyper-stoichiometric aluminum ingots of NiAl, for example Ni 40-Al60 (a/o), are brittle and susceptible to breakage during casting and machining.

Where mechanical integrity dictates the fabrication of an ingot of a particular chemical composition, evaporated line-of-sight deposits of a desired chemical composition may not be practical. To make an evaporated deposit of a desired chemical composition, when using such ingots, embodied by the work piece is positioned at a location offset from the line-of-sight 40 of the vapor deposit. This method facilitates the determination of such work piece position and, therefore, the coating of the work piece of a desired material composition.

The method of the invention can be extended to the making of evaporated deposits on several work pieces 1701. Each work piece 1701 is positioned at equal vertical distances 'z' and horizontally displaced distances 'y' from the line-of-sight 40 of the vapor source 130. The horizontal and vertical distances correspond to that of a test substrate upon which a deposit of desired composition is condensed. In doing so, several work pieces can be coated simultaneously, thereby providing for efficiencies of scale and reduction in waste material that is evaporated from the molten pool without coating a work piece. Thus, the present invention provides a method for making evaporated deposits on a plurality of work pieces by positioning at least one test substrate 160, wherein at least a portion of the at least one test substrate 160 is not in-line-of-sight of the vapor source; heating the test substrates 160 in a vacuum; heating the vapor source in a vacuum to evaporate the vapor source; condensing a not in-line-of-sight deposit 170 evaporated from the vapor source on the at least one test substrate 160; measuring the chemical composition of the deposit condensed thereon; removing the at least one test substrate 160; positioning a plurality of work pieces 1701 above the vapor source, in which the vertical distance 'z' above the vapor source and the horizontally displaced distances 'x', 's', from the line-of-sight 40 of the vapor source for each of the work pieces 1701 correspond to those of the at least one test substrate 160 upon which a non-line-of-sight deposit of desired chemical composition was condensed and measured, heating the work pieces 160 and the vapor source in a vacuum enclosure 110 to evaporate the vapor source, and condensing deposits 170 evaporated from the vapor source on the workpieces 1701.

The invention may be practiced in apparatuses commonly used for thermal or electron beam evaporation processes. Referring to FIG. 3, the method is described in the context of such an apparatus. Such an apparatus 100 typically comprises housing (housing means) 110 that is adapted to be evacuated by a pump; such as but not limited to at least one of staged mechanical, cryogenic and diffusion pumps and combinations thereof. Apparatus 100 also typically comprises crucible (crucible means) 120 that is used to contain the materials to be evaporated during the evaporation process. Crucible 120 may comprise any suitable receptacle. In the case of the evaporation of many metal alloys, that water-cooled, copper crucibles can be provided as the crucible 120. In the method, material 130 to be evaporated is placed in the crucible 120 to act as a vapor source. Apparatus 100 also comprises heater, such as an electron gun 150. Electron gun 150 as a heat sources for evaporation may be combined with various automatic control mechanisms to adjust the energy supplied to the material. Apparatus 100 also comprises a plurality of workpieces 1701, positioned at various first horizontally-displaced distances 'y' from the line of sight 40 of the vapor source 130. The workpieces 1701 collect the deposit 170 that condenses from the vapor steam created during the course of the evaporation process as heat is supplied to molten metal material 130. After a deposit 170 having a desired chemical composition has been condensed and measured by use of the method shown in FIGS. 1 & 2 and described above, the test substrate 160 can be replaced with actual workpieces 1701 at a horizontally displaced position 'y' corresponding to that of the test substrate 160 upon which the deposit having a desired composition has been condensed and measured. Thus, the workpieces 1701 can be coated with a desired chemical composition.

The housing 110 is evacuated of air in preparation for beginning the evaporation process. Heaters such as an electron gun 150, can then be used to raster an electron beam 190 across the top surface of vapor source material 130. Heating caused by the electron beam 190 produces a molten zone. Further heating causes evaporation of material in vapor source 130, creating a vapor stream. Vapor stream condenses as deposit 170 on the workpieces 1701.

The apparatus 100 may also comprise an additional quantity of additional, second material that allows for maintenance of vapor stream during the course of the evaporation process. Further, apparatus 100 may also comprise a replenishment source for replenishing any amounts of material that are lost during the process of evaporation. Other additional features and elements such as automated control of replenishment material for the vapor source, deposition rate sensors for incorporation into feedback controllers, and means for modifying the vapor stream such as by addition of various electrical potentials and other elements may be included in the apparatus 100.

The apparatus, as described above, comprises only a single evaporative source. Additional evaporation sources, (not shown) may be utilized to modify vapor stream, for example a source that would deposit additional alloying elements in which a metal alloy was being deposited from the crucible 120. Further, other elements or compounds may also be introduced back into the housing 110 in order to react with one or more of the elements present in vapor stream or deposit 170. Such elements or compounds include, but are not limited to, at least one of oxygen, nitrogen, methane, and other reactive species for the evaporation of metal alloys.

The invention will be described in further details with reference to the following non-limiting examples. In the examples, compositions are provided in approximate atomic percent (unless otherwise specified), and other values are approximate.

EXAMPLE 1

A Ni 50-Al 50 (a/o) alloy is heated by a 20 kw electron beam to liquification and evaporation took place from the molten pool thereby formed. The evaporation is conducted in a housing comprising a stainless steel vacuum chamber. Background pressure during the deposition is less than about $1 \times 10^{-4}$ torr. The crucible comprises three water-cooled copper crucibles with a 1 inch diameter longitudinal bore through its center that is adapted to receive Ni 50-Al 50 (a/o) ingots. The substrate is heated by a 8 kW electron beam to approximately 1800° F. The collector or workpiece comprises a metal strip about 1000 mm in length. The vertical distance of the substrate from the evaporating molten pool is about 305 mm.

Figure 4:
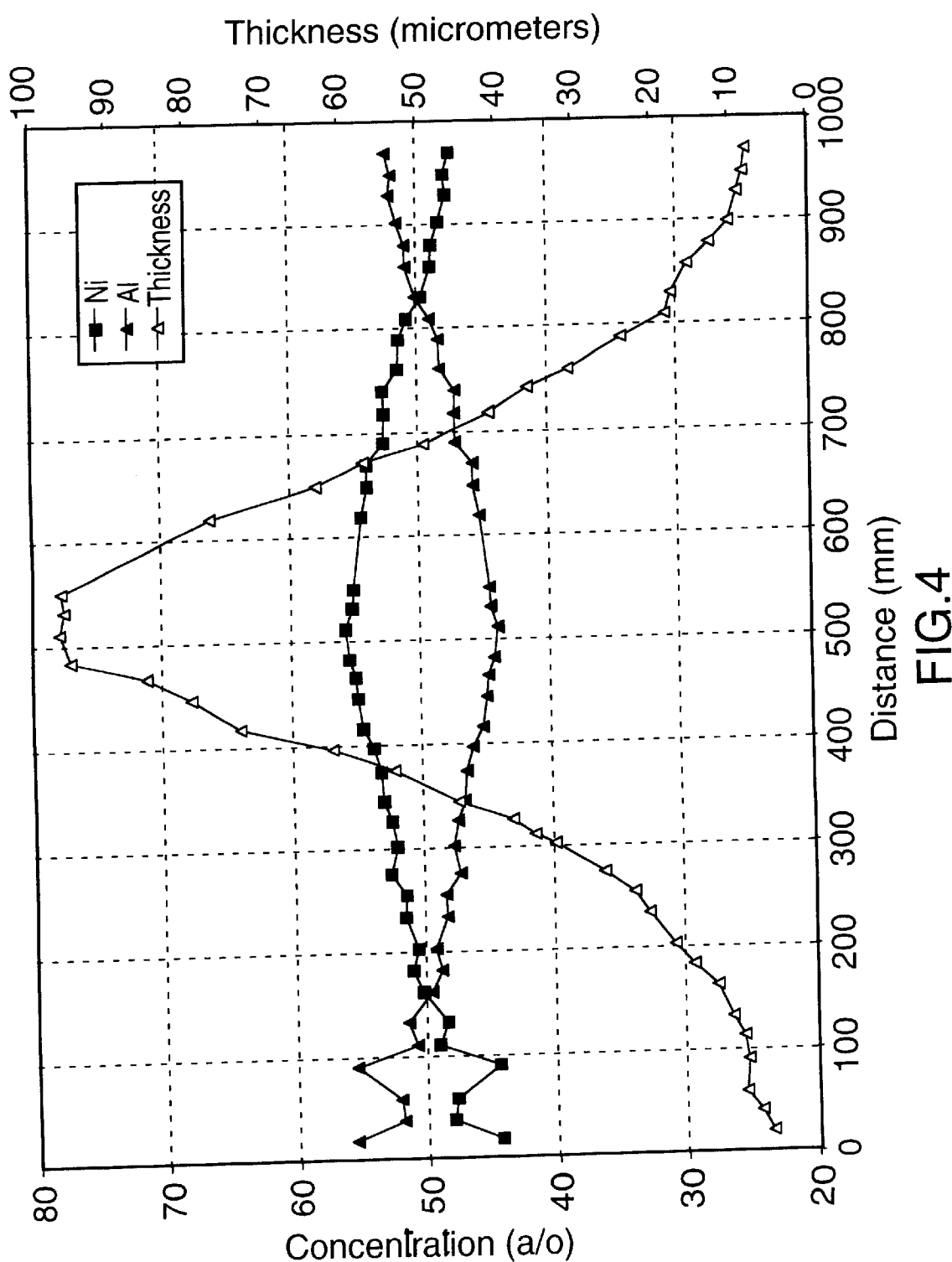
FIG. 4 is a graph illustrating the thickness and composition versus distance from a center line of a deposit evaporated from a Ni 50-Al 50 (a/o) alloy ingot by an electron beam.

Electron micro probe results of thickness and composition versus distance for the deposit obtained under the above-described conditions are graphed in FIG. 4. Referring to FIG. 4, the normal, or center line, to the molten pool is located at about 500 mm distance. The center line composition is measured to be Ni 55-Al 45 (a/o), while at ± about 300 mm from the center line, the composition is about Ni 50-Al 50 (a/o).

Thus, a specific deposit chemistry may be obtained by positioning substrates at different locations above the evaporating pool consisting of Ni 50-Al 50 (a/o). This result reflects that varying the composition of the molten pool from Ni 50-Al 50 (a/o), to achieve a specific deposit chemistry, is not desirable. Ni—Al alloy ingots of compositions varying from Ni 50-Al 50 (a/o) are mechanically unstable and, therefore, are of limited value as a feedstock for the molten pool.

EXAMPLE 2

Evaporation of a Ni 70.9-Co 5.3-Cr 10.6-Al 13.2 (a/o) metal alloy from a molten pool is conducted using the apparatus and under the conditions described in Example 1.

Figure 5:
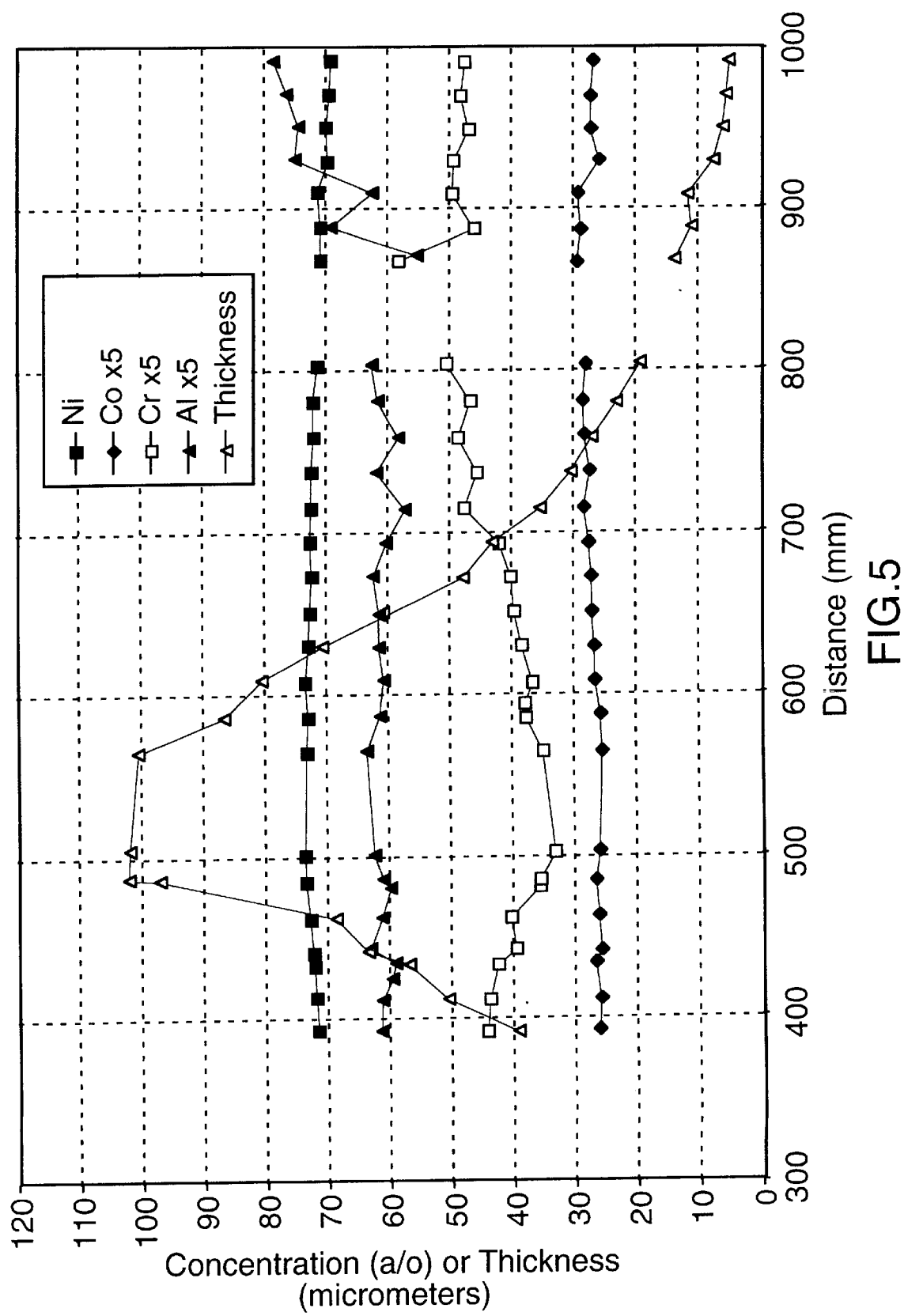
FIG. 5 is a graph illustrating the thickness and composition versus distance from the center line of a deposit evaporated from a Ni 70.9-Co 5.3-Cr 10.6-Al 13.2 (a/o) alloy ingot by an electron beam.

Electron micro probe results of thickness and composition versus distance for the deposit obtained under the above-described conditions are graphed in FIG. 5. Referring to FIG. 5, the normal or center line of the evaporating Ni—Co—Cr—Al liquid pool is located at about 500 mm distance. On the center line, the composition is about Ni 74.7-Co 5.4-Cr 7.1-Al 12.8 (a/o), while at ± about 300 mm from the center line, or at about 200 mm and about 800 mm distances, the composition is about Ni 71.6-Co 5.6-Cr 10.2-Al 12.6 (a/o). Thus, a chemistry, may be obtained by positioning substrates at different locations above the evaporating Ni—Co—Cr—Al liquid pool.

The vapor source can comprise liquid in a crucible, and the liquid in the crucible can be maintained at a substantially constant level. The evaporant source material is typically a metal alloy, such as a metal alloy comprising nickel and aluminum. The vapor source can be heated by an electron beam, but is not limited thereto and other heating of the evaporant source may be used, for example induction heating or resistance heating.

The measurement of the chemical composition of the coating deposited on the test substrate may be carried out by atomic spectroscopy or other know methods of composition measurement.

The chemical composition of the deposit applied to the article or workpiece by the method or methods of the invention is typically different than that of the vapor source. This difference arises due to the substrate being horizontally displaced from a perpendicular line extending upward from the molten surface of the vapor source, wherein the chemical composition of the deposit on the substrate fluctuates depending on the horizontally displaced distance of the workpiece from such line. It may be desired to obtain a deposit of a certain chemical composition on a workpiece, but it may be physically impossible to obtain material incompatibly problems or the like to create a homogeneous vapor source of the desired chemical combination for deposition on a workpiece. Using the method of the invention, uniform and consistent depositions of materials on substrates may be formed that have chemical compositions, and thus chemical properties, different up to a certain extent than the chemical composition and chemical properties of the vapor source.

While various embodiments are described herein, it will be appreciated from the specification that various combinations of elements, variations or improvements therein may be made by those skilled in the art, and are within the scope of the invention.

We claim:

1. A method for forming deposits of a multicomponent composition on a plurality of workpieces, the method comprising:
   i) disposing a plurality of workpieces above a vapor source, each workpiece positioned at a first vertical distance above the vapor source and at a first horizontally-displaced distance from a line extending perpendicularly upward from the vapor source said vertical and horizontally-displaced distances being selected so as to provide a specific desired composition of said multicomponent composition;
   ii) heating the vapor source in a vacuum and evaporating a part of the vapor source; and
   iii) condensing deposits evaporated from the vapor source on the workpieces wherein the deposits possess the specific desired composition along the first horizontally displaced distance.

2. The method of claim 1, wherein the first vertical distance above the vapor source and the first horizontally displaced distance from the line are determined by:
   (i) disposing an elongate test specimen a spaced distance above a vapor source so that the test specimen disposes a surface extending horizontally from a line extending perpendicularly upward from the vapor source to a position horizontally displaced from the line;
   (ii) heating the vapor source in a vacuum to evaporate the vapor source;
   (iii) condensing a deposit evaporated from the vapor source on the surface of the test specimen;
   (iv) measuring the chemical composition of the deposit on the surface at various horizontally displaced positions thereon relative to the line; and
   (v) determining as a desired horizontally displaced distance the horizontally-displaced distance which provided a deposit of the desired chemical composition.

3. The method of claim 2, wherein the vapor source comprises a heated liquid in a crucible, and the liquid is maintained at a substantially constant level.

4. The method as claimed in claim 2, wherein the vapor source comprises a metal alloy comprising nickel and aluminum.

5. The method as claimed in claim 2, wherein the vapor source is heated by an electron beam.

6. The method of claim 1, wherein the first vertical distance above the vapor source and the first horizontally displaced distance from the line corresponds to those distances determined by the following steps:
   (i) disposing a plurality of test specimens a spaced distance above a vapor source and horizontally spaced various distances from a line extending perpendicularly upward from the vapor source from the line;

(ii) heating the vapor source in a vacuum to evaporate the vapor source;

(iii) condensing a deposit evaporated from the vapor source on the test specimens;

(iv) measuring the chemical composition of the deposit on the specimens; and (v) determining as a desired horizontally displaced distance for the workpieces the horizontally-displaced distance that provided a deposit of the desired chemical composition on a test specimen.

7. The method of claim 6, wherein the vapor source comprises a heated liquid in a crucible, and the liquid is maintained at a substantially constant level.

8. The method as claimed in claim 6, wherein the vapor source comprises a metal alloy comprising nickel and aluminum.

9. The method as claimed in claim 6, wherein the vapor source is heated by an electron beam.

10. The method of claim 1, wherein the first vertical distance above the vapor source and the first horizontally displaced distance from the line corresponds to those distances determined by the following steps:

(i) disposing a test specimen a spaced distance above a vapor source and a horizontally spaced distance from a line extending perpendicularly upward from the vapor source from the line;

(ii) heating the vapor source in a vacuum to evaporate the vapor source;

(iii) condensing a deposit evaporated from the vapor source on the test specimen;

(iv) measuring the chemical composition of the deposit on the specimens;

(v) repeating steps (i) to (iv) above, in which the step of repeating comprises disposing the test specimen a different horizontally spaced distance from the line; and (vi) determining as a desired horizontally displaced distance and vertical spaced distance for the workpieces the horizontally-displaced distance and vertically spaced distance that provided a deposit of the desired chemical composition on a test specimen.

11. The method of claim 10, wherein the vapor source comprises a heated liquid in a crucible, and the liquid is maintained at a substantially constant level.

12. The method as claimed in claim 10, wherein the vapor source comprises a metal alloy comprising nickel and aluminum.

13. The method as claimed in claim 10, wherein the vapor source is heated by an electron beam.

* * * * *